United States Patent
Kim et al.

(10) Patent No.: US 8,593,228 B2
(45) Date of Patent: Nov. 26, 2013

(54) SPREAD SPECTRUM CLOCK GENERATORS AND ELECTRONIC DEVICES INCLUDING THE SAME

(75) Inventors: Bong-Jin Kim, Suwon-si (KR); DongUk Park, Hwaseong-si (KR); Jongshin Shin, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/597,593

(22) Filed: Aug. 29, 2012

(65) Prior Publication Data
US 2012/0327974 A1 Dec. 27, 2012

Related U.S. Application Data

(62) Division of application No. 12/982,115, filed on Dec. 30, 2010, now Pat. No. 8,269,565.

(30) Foreign Application Priority Data

Jan. 13, 2010 (KR) .......................... 10-2010-0003202

(51) Int. Cl.
*H03B 29/00* (2006.01)
(52) U.S. Cl.
USPC ............. 331/78; 708/250; 708/251; 708/252; 375/130; 370/278; 370/282
(58) Field of Classification Search
USPC ..................... 370/278, 282; 331/78; 375/130; 708/252, 250, 251
See application file for complete search history.

(56) References Cited

U.S. PATENT DOCUMENTS

| 6,046,646 A | 4/2000 | Lo et al. |
| 6,072,823 A * | 6/2000 | Takakusaki .................. 375/130 |
| 7,233,210 B2 | 6/2007 | Kaizuka |
| 7,561,652 B2 | 7/2009 | Hall et al. |
| 7,944,319 B2 * | 5/2011 | Kerr et al. ..................... 332/144 |
| 8,233,567 B2 * | 7/2012 | Dally ............................ 375/316 |

FOREIGN PATENT DOCUMENTS

| JP | 2006-211479 | 8/2006 |
| JP | 2007-336271 | 12/2007 |
| KR | 1020090108412 A | 10/2009 |

* cited by examiner

*Primary Examiner* — Arnold Kinkead
(74) *Attorney, Agent, or Firm* — Myers Bigel Sibley & Sajovec PA

(57) ABSTRACT

Spread spectrum clock generators and electronic devices including the same are provided. An electronic device may include a memory and a first circuit block configured to output a first spread spectrum clock signal and a first address for accessing the memory. The electronic device may include a second circuit block configured to operate in response to a second spread spectrum clock signal, and configured to output a second address for accessing the memory. The electronic device may include a spread spectrum clock signal generator configured to receive the first spread spectrum clock signal to generate the second spread spectrum clock signal. The memory may be configured to compare the first and second addresses to each other to output a clock generator control signal corresponding to a difference between the first and second addresses.

7 Claims, 13 Drawing Sheets

SPREAD SPECTRUM CLOCK GENERATORS AND ELECTRONIC DEVICES INCLUDING THE SAME

CROSS-REFERENCE TO RELATED APPLICATIONS

This U.S. non-provisional patent application is a divisional of U.S. patent application Ser. No. 12/982,115, filed on Dec. 30, 2010 now U.S. Pat. No. 8,269,565, which claims priority under 35 U.S.C. §119 to Korean Patent Application No. 10-2010-0003202, filed on Jan. 13, 2010, the contents of which are hereby incorporated by reference in their entireties.

BACKGROUND

The present disclosure herein relates to spread spectrum clock generators and electronic devices including the same.

As the resolution of recent liquid crystal displays (LCDs) increases and the number of data input bits increases, the number of bus lines between a timing controller and a driver may also increase, and thus data traffic jams and electromagnetic interference may be caused. Research with respect to various signal processing methods, together with various interface methods such as reduced signal differential signaling (RSDS), low voltage differential signaling (LVDS), point-to-point differential signaling (PPDS), etc., has been conducted to address electromagnetic interference.

SUMMARY

The present disclosure provides spread spectrum clock generators that may receive a spread spectrum clock signal to generate a spread spectrum clock signal having a new modulation rate and modulation frequency, and electronic devices including the same.

Some embodiments provide a spread spectrum clock generator that includes an oscillation circuit that is configured to receive a first spread spectrum clock signal and to output an average frequency signal corresponding to an average frequency of the first spread spectrum clock signal. The spread spectrum clock generator may also include a phase lock loop that is configured to receive the average frequency signal and to generate a second spread spectrum clock signal. The spread spectrum clock generator may further include a control circuit that is configured to receive the first and second spread spectrum clock signals and to output a phase lock loop control signal to control the phase lock loop in response thereto such that an average frequency of the second spread spectrum clock signal approaches the average frequency of the first spread spectrum clock signal.

In some embodiments, the oscillation circuit may include a digital controlled oscillator that is configured to output the average frequency signal. The oscillation circuit may also include a first counter that is configured to receive the first spread spectrum clock signal to output a first count signal, and a second counter that is configured to receive the average frequency signal to output a second count signal. The oscillation circuit may further include a first controller that is configured to output a digital controlled oscillator control signal for controlling the digital controlled oscillator in response to the first and second count signals. According to some embodiments, the average frequency signal output from the digital controlled oscillator has a frequency corresponding to that of the digital controlled oscillator control signal.

In some embodiments, the first counter may be configured to perform a count operation in response to the first spread spectrum clock signal to output the first count signal, and the second counter may be configured to perform a count operation in response to the average frequency signal to output the second count signal.

In some embodiments, the first controller may be configured to increase a signal level of the digital controlled oscillator control signal if the first count signal reaches a predetermined value before the second count signal, and the first controller may be configured to decrease the signal level of the digital controlled oscillator control signal if the second count signal reaches the predetermined value before the first count signal.

In some embodiments, the first controller may be configured to change the digital controlled oscillator control signal in a binary search algorithm in response to the first and second count signals.

In some embodiments, the control circuit may include a third counter that is configured to receive the first spread spectrum clock signal to output a third count signal, and a fourth counter that is configured to receive the second spread spectrum clock signal output from the phase lock loop to output a fourth count signal. The control circuit may also include a second controller that is configured to output the phase lock loop control signal for controlling the phase lock loop in response to the third and fourth count signals. The phase lock loop may be configured to control a frequency of the second spread spectrum clock signal in response to the phase lock loop control signal.

In some embodiments, the third counter may be configured to perform a count operation in response to the first spread spectrum clock signal to output the third count signal, and the fourth counter may be configured to perform a count operation in response to the second spread spectrum clock signal to output the fourth count signal.

In some embodiments, the second controller may be configured to increase a signal level of the phase lock loop control signal if the third count signal reaches a predetermined value before the fourth count signal, and the second controller may be configured to decrease the signal level of the phase lock loop control signal if the fourth count signal reaches the predetermined value before the third count signal.

In some embodiments, the spread spectrum clock generator may further include an adder that is configured to combine the digital controlled oscillator control signal output from the first controller and the phase lock loop control signal output from the second controller to provide a combined signal to the digital controlled oscillator.

In some embodiments, the first spread spectrum clock signal may include a signal having a first modulation rate and a first modulation frequency, and the second spread spectrum clock signal may include a signal having a second modulation rate and a second modulation frequency.

In other embodiments, the average frequency signal output from the oscillation circuit may have a fractional division ratio of the average frequency of the first spread spectrum clock signal. According to some embodiments, the control circuit may be configured to control the phase lock loop such that the average frequency of the second spread spectrum clock signal approaches the fractional division ratio of the average frequency of the first spread spectrum clock signal.

In further embodiments, the spread spectrum clock generator may further include a reference oscillation circuit that is configured to receive the first spread spectrum clock signal to output a reference average frequency signal corresponding to the average frequency of the first spread spectrum clock signal. According to some embodiments, the phase lock loop may be configured to receive the average frequency signal from the oscillation circuit and to generate the second spread spectrum clock signal using the reference average frequency signal as a reference clock signal.

In some embodiments, the first modulation rate may be different from the second modulation rate and the first modulation frequency may be different from the second modulation frequency.

In some embodiments, the second spread spectrum clock signal may include a substantially uniform power density across a spread spectrum.

In other embodiments, an electronic device may include a memory and a first circuit block that is configured to output a first spread spectrum clock signal and a first address for accessing the memory. The electronic device may also include a second circuit block that is configured to operate in response to a second spread spectrum clock signal. According to some embodiments, the second circuit block may be configured to output a second address for accessing the memory. The electronic may further include a spread spectrum clock signal generator that is configured to receive the first spread spectrum clock signal to generate the second spread spectrum clock signal. According to some embodiments, the memory may be configured to compare the first and second addresses to each other to output a clock generator control signal corresponding to a difference between the first and second addresses. According to some embodiments, the spread spectrum clock signal generator may be configured to generate the second spread spectrum clock signal in response to the clock generator control signal.

In some embodiments, the spread spectrum clock signal generator may include a first controller that is configured to output a digital controlled oscillator control signal corresponding to the clock generator control signal from the memory. The spread spectrum clock signal generator may also include a digital controlled oscillator that is configured to output an average frequency signal having a frequency corresponding to that of the digital controlled oscillator control signal. The spread spectrum clock signal generator may further include a second controller that is configured to output a phase lock loop control signal corresponding to the clock generator control signal from the memory. The spread spectrum clock signal generator may additionally include a phase lock loop that is configured to receive the average frequency signal and to output the second spread spectrum clock signal in response to the phase lock loop control signal.

In some embodiments, the spread spectrum clock signal generator may be configured to increase a frequency of the second spread spectrum clock signal if the difference between the first and second addresses is greater than a first reference value.

In some embodiments, the spread spectrum clock signal generator may be configured to decrease a frequency of the second spread spectrum clock signal if the difference between the first and second addresses is less than a second reference value.

In some embodiments, the memory may include a dual port static random access memory.

In some embodiments, a spread spectrum clock generator may include an oscillation circuit that is configured to receive a first spread spectrum clock signal and to output an average frequency signal corresponding to an average frequency of the first spread spectrum clock signal. The oscillation circuit may include a digital controlled oscillator that is configured to output the average frequency signal. The oscillation circuit may also include a first counter that is configured to perform a count operation in response to the first spread spectrum clock signal and to output the first count signal. The oscillation circuit may further include a second counter that is configured to perform a count operation in response to the average frequency signal and to output the second count signal. The oscillation circuit may additionally include a controller that is configured to output a digital controlled oscillator control signal for controlling the digital controlled oscillator in response to the first and second count signals. The controller within the oscillation circuit may be configured to increase a signal level of the digital controlled oscillator control signal if the first count signal reaches a predetermined value before the second count signal, and the controller within the oscillation circuit may be configured to decrease the signal level of the digital controlled oscillator control signal if the second count signal reaches the predetermined value before the first count signal. The average frequency signal output from the digital controlled oscillator may have a frequency corresponding to that of the digital controlled oscillator control signal. The spread spectrum clock generator may also include a phase lock loop that is configured to receive the average frequency signal and to generate a second spread spectrum clock signal. The spread spectrum clock generator may further include a control circuit that is configured to receive the first and second spread spectrum clock signals and to output a phase lock loop control signal to control the phase lock loop in response thereto such that an average frequency of the second spread spectrum clock signal approaches the average frequency of the first spread spectrum clock signal.

BRIEF DESCRIPTION OF THE DRAWINGS

The foregoing and other features and advantages of the disclosure will become more apparent by describing in detail exemplary embodiments thereof with reference to the following drawings.

DETAILED DESCRIPTION OF EXAMPLE EMBODIMENTS

Figure 1:
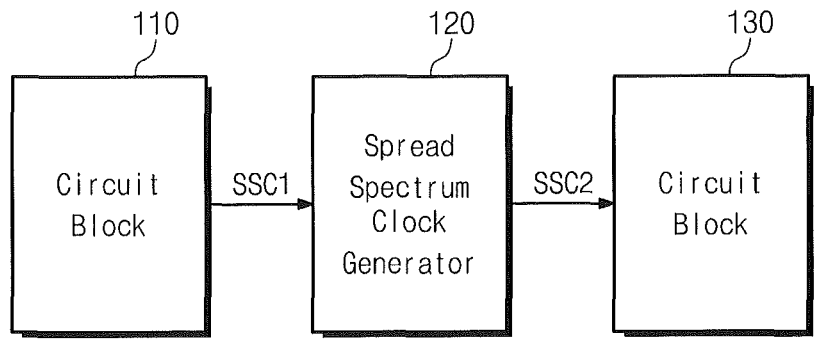
FIG. 1 is a block diagram of an electronic circuit including a spread spectrum clock generator according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of an electronic circuit including a spread spectrum clock generator 120 according to some embodiments.

Referring to FIG. 1, the spread spectrum clock generator 120 may be connected to two circuit blocks 110 and 130. The circuit block 110 may generate a first spread spectrum clock signal SSC1 having a first modulation rate and a first modulation frequency. The spread spectrum clock generator 120 may receive the first spread spectrum clock signal SSC1 to generate a second spread spectrum clock signal SSC2 having a second modulation rate and a second modulation frequency. The second spread spectrum clock signal SSC2 generated from the spread spectrum clock generator 120 may be supplied to the circuit block 130.

Figure 2:
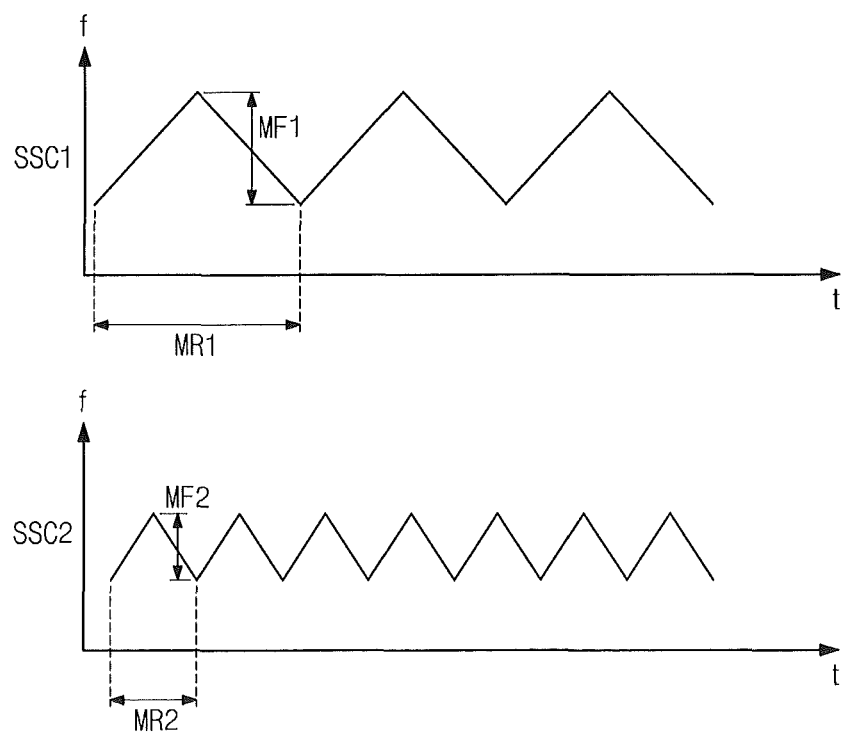
FIG. 2 includes graphs illustrating examples of spread spectrum clocks input and output into/from the spread spectrum clock generator of FIG. 1.

FIG. 2 includes graphs illustrating examples of spread spectrum clocks input and output into/from the spread spectrum clock generator 120 of FIG. 1.

Referring to FIG. 2, the first spread spectrum clock signal SSC1 input into the spread spectrum clock generator 120 may have the first modulation rate MR1 and the first modulation frequency MF1. The spread spectrum clock generator 120 may output the second spread spectrum clock signal SSC2 having the second modulation rate MR2 and the second modulation frequency MF2.

As described above, the spread spectrum clock generator 120 may receive the first spread spectrum clock signal SSC1 to output the second spread spectrum clock signal SSC2 having a novel modulation rate and modulation frequency. For example, the spread spectrum clock generator 120 may receive a clock signal having a fixed modulation rate and modulation frequency as well as a spread spectrum clock signal having various modulation rates and modulation frequencies to output a spread spectrum clock signal having a desired modulation rate and modulation frequency.

Figure 3:
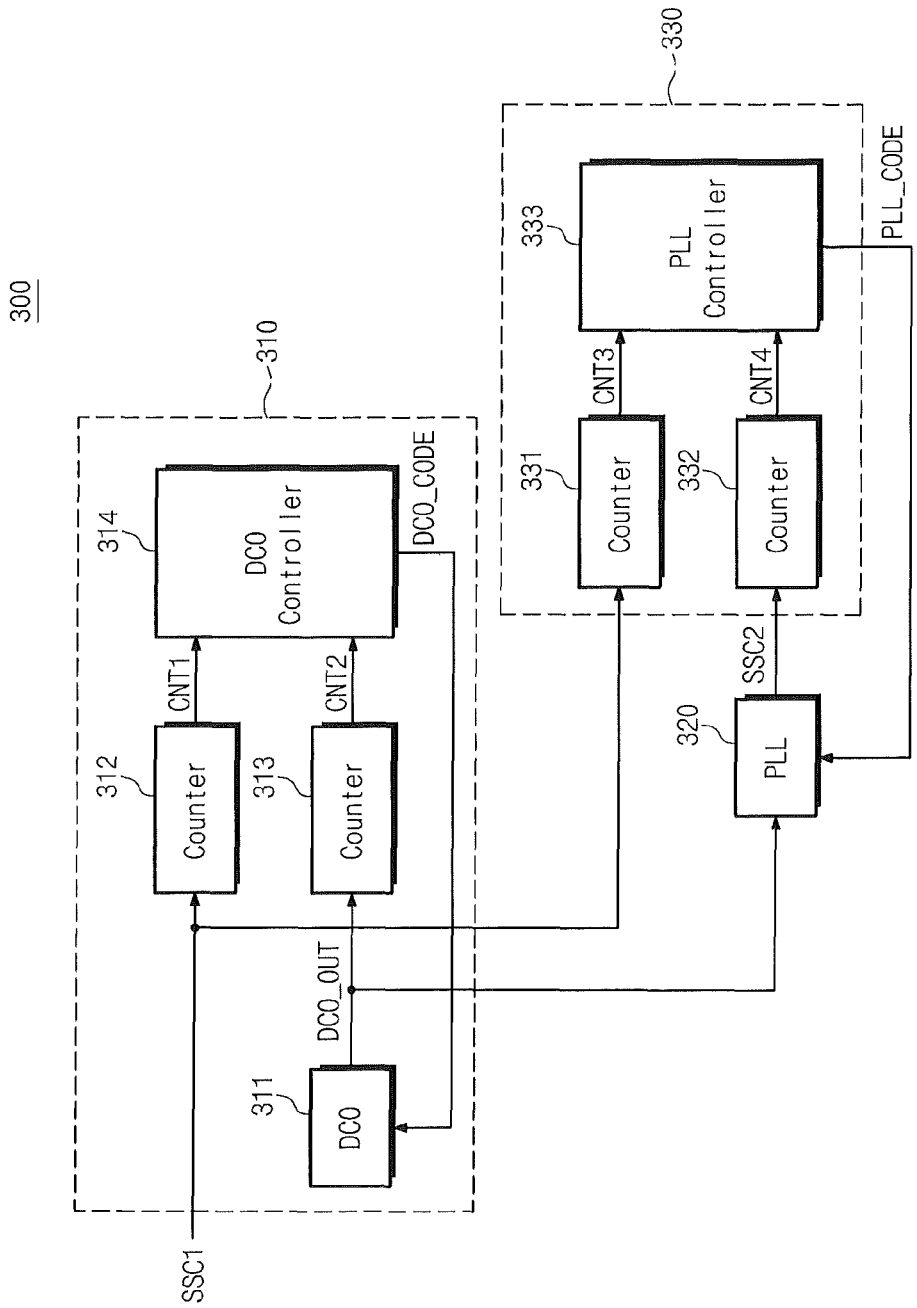
FIG. 3 is a block diagram illustrating a spread spectrum clock generator according to some embodiments.

FIG. 3 is a block diagram illustrating a spread spectrum clock generator 300 according to some embodiments.

Referring to FIG. 3, the spread spectrum clock generator 300 may include an oscillation circuit 310, a phase lock loop (PLL) 320, and a control circuit 330. The oscillation circuit 310 may receive a first spread spectrum clock signal SSC1 to output an average frequency signal DCO_OUT corresponding to an average frequency of the first spread spectrum clock signal SSC1. The phase lock loop 320 may receive the average frequency signal DCO_OUT to output a second spread spectrum clock signal SSC2. The control circuit 330 may receive the first spread spectrum clock signal SSC1 and the second spread spectrum clock signal SSC2 to output a PLL control signal PLL_CODE for controlling the phase lock loop 320.

As described in FIG. 2, the first spread spectrum clock signal SSC1 input into the spread spectrum clock generator 300 may have a first modulation rate MR1 and a first modulation frequency MF1. It may be difficult to obtain the second spread spectrum clock signal SSC2 having a desired modulation rate and modulation frequency by directly inputting the first spread spectrum clock signal SSC1 into the phase lock loop 320. Accordingly, in some embodiments, the oscillation circuit 310 may generate the average frequency signal DCO_OUT corresponding to the average frequency of the first spread spectrum clock signal SSC1, and the phase lock loop 320 may generate the second spread spectrum clock signal SSC2 using the average frequency signal DCO_OUT.

The oscillation circuit 310 may include a digital controlled oscillator (DCO) 311, counters 312 and 313, and a DCO controller 314. The DCO 311 may output an average frequency signal DCO_OUT. The average frequency signal DCO_OUT may have a frequency corresponding to that of a DCO control signal DCO_CODE, which may be a digital signal. An initial frequency of the average frequency signal DCO_OUT output from the DCO 311 may be set to a predetermined level. For example, the initial frequency of the average frequency signal DCO_OUT may be set to any one of a maximum frequency, a minimum frequency, and an intermediate frequency.

The counter 312 may perform a count operation in response to the first spread spectrum clock signal SSC1 to output a count signal CNT1. The counter 313 may perform a count operation in response to the average frequency signal DCO_OUT output from the DCO 311 to output a count signal CNT2. The respective counters 312 and 313 may include a non-response counter including a plurality of flip-flops. The DCO controller 314 may output the DCO control signal DCO_CODE in response to the count signals CNT1 and CNT2 output from the counters 312 and 313. The DCO controller 314 may increase or decrease a digital value of the DCO control signal DCO_CODE according to whether any one of the two counters 312 and 313 reaches a predetermined value. For example, when the count signal CNT1 output from the counter 312 reaches the predetermined value before the count signal CNT2 output from the counter 313, the DCO controller 314 may increase the digital value of the DCO control signal DCO_CODE. If the DCO control signal DCO_CODE is 10 bits and a search algorithm of the DCO controller 314 is a uni-directional search, it may be necessary to change the DCO control signal DCO_CODE through up to 1,024 variations to allow the DCO 311 to output the average frequency signal DCO_OUT corresponding to the average frequency of the first spread spectrum clock signal SSC1. In some embodiments, to improve an operation speed of the spread spectrum clock generator 300, the DCO controller 314 may output the DCO control signal DCO_CODE according to a binary search algorithm.

Figure 4:
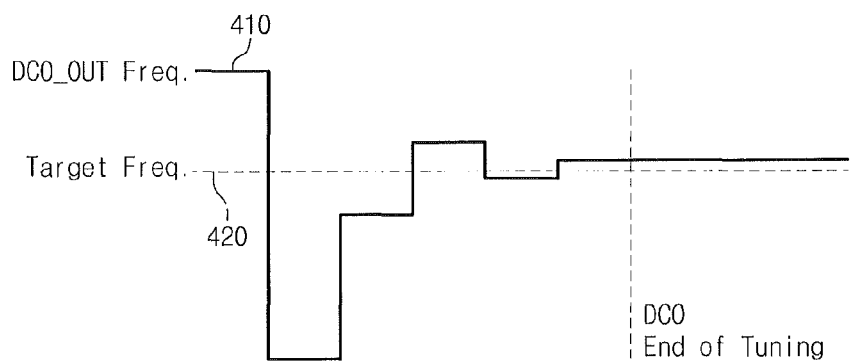
FIG. 4 is a view illustrating an example of a frequency variation of an average frequency signal output from a digital controlled oscillator of FIG. 3.

FIG. 4 is a view illustrating an example of a frequency variation of the average frequency signal DCO_OUT output from the DCO 311 of FIG. 3.

Referring to FIG. 4, a target frequency 420 may represent a mathematical average frequency of the first spread spectrum clock signal SSC1. A frequency 410 of the average frequency signal DCO_OUT output from the DCO 311 may be changed during a tuning process according to the DCO control signal DCO_CODE. The DCO controller 314 shown in FIG. 3 may generate the DCO control signal DCO_CODE according to the binary search algorithm to provide faster operations than a unidirectional search algorithm.

For convenience of description, an operation of the oscillation circuit 310 shown in FIG. 3 will be described below assuming that the DCO control signal DCO_CODE is 5 bits. Referring to FIG. 4, if a frequency 410 of an initial average frequency signal DCO_OUT output from the DCO 311 is greater than a target frequency 420, a count signal CNT2 output from the counter 313 may reach the predetermined value before a count signal CNT1 output from the counter 312. The DCO controller 314 may output a DCO control signal DCO_CODE of '00000' at the beginning of the tuning process and then, when the count signal CNT2 reaches the predetermined value, the most significant bit of the DCO control signal DCO_CODE may be set to '1'. Thus, the DCO control signal DCO_CODE may be set to '10000,' and the DCO 311 may output a frequency signal DCO_CODE having a frequency corresponding to that of the DCO control signal DCO_CODE. According to the above-described process, the DCO controller 314 may change the DCO control signal DCO_CODE according to an order of '01000,' '00100,' '00110,' and '00101.' As a result, the frequency of the average frequency signal DCO_OUT may be substantially in accord with, or may otherwise come close to, a mathematical average/mean frequency of the first spread spectrum clock signal SSC1.

According to a binary search algorithm, the DCO control signal. DCO_CODE may be changed a maximum of, for example, 5 times to reduce a setting time of the DCO control signal DCO_CODE when compared to a unidirectional search algorithm. However, an error between the target frequency 420 and the frequency 410 of the frequency signal DCO_OUT may occur according to the resolution/precision of the DCO control signal DCO_CODE (in other words, according to the bit width of the DCO control signal). An error between the frequency of the average frequency signal DCO_OUT and the average frequency of the first spread spectrum clock signal SSC1 may be compensated by the control circuit 330, as will be described below in detail.

The average frequency signal DCO_OUT output from the DCO 311 may be input into the phase lock loop 320. The phase lock loop 320 may receive the average frequency signal DCO_OUT to generate the second spread clock signal SSC2, which may have a predetermined division ratio and division frequency.

If the frequency of the average frequency signal DCO_OUT output from the DCO 311 accords with the mean frequency of the first spread spectrum clock signal SSC1, then the second spread spectrum clock signal SSC2 output from the phase lock loop 320 has a desired division ratio and division frequency designed by a user. The control circuit 330 may thus compensate for the error between the frequency of the average frequency signal DCO_OUT output from the DCO 311 and the mathematical average/mean frequency of the first spread spectrum clock signal SSC1.

The control circuit 330 may include counters 331 and 332 and a PLL controller 333. The counter 331 may perform a count operation in response to the first spread spectrum clock signal SSC1 to output a count signal CNT3. The counter 332 may perform a count operation in response to the second spread spectrum clock signal SSC2 output from the phase lock loop 320 to output a count signal CNT4. The respective counters 331 and 332 may include a non-response counter including a plurality of flip-flops. The PLL controller 333 may output a PLL control signal PLL_CODE in response to the count signals CNT3 and CNT4 output from the counters 331 and 332. The PLL controller 333 may increase or decrease a digital value of the PLL control signal PLL_CODE according to whether one of the two counters 331 and 332 reaches a predetermined value before the other. For example, when the count signal CNT3 output from the counter 331 reaches the predetermined value before the count signal CNT4 output from the counter 332, the PLL controller 333 may increase the digital value of the PLL control signal PLL_CODE. Also, when the count signal CNT4 output from the counter 332 reaches the predetermined value before the count signal CNT3 output from the counter 331, the PLL controller 333 may decrease the digital value of the PLL control signal PLL_CODE.

Because the second spread spectrum clock signal SSC2 output from the phase lock loop 320 may be determined by the average frequency signal DCO_OUT output from the DCO 311 and a multiplication factor of the phase lock loop 320, an error may occur between the second spread spectrum clock signal SSC2 and the initial first spread spectrum clock signal SSC1. Thus, it may be helpful to finely control the second spread spectrum clock signal SSC2 output from the phase lock loop 320 to output the second spread spectrum clock signal SSC2 according to a value obtained by multiplying the average frequency of the first spread spectrum clock signal by the multiplication factor of the phase lock loop 320. The PLL controller 333 may be realized using a digital logic circuit. Also, the PLL controller 333 may control the PLL control signal PLL_CODE in a unidirectional searching manner.

Figure 5:
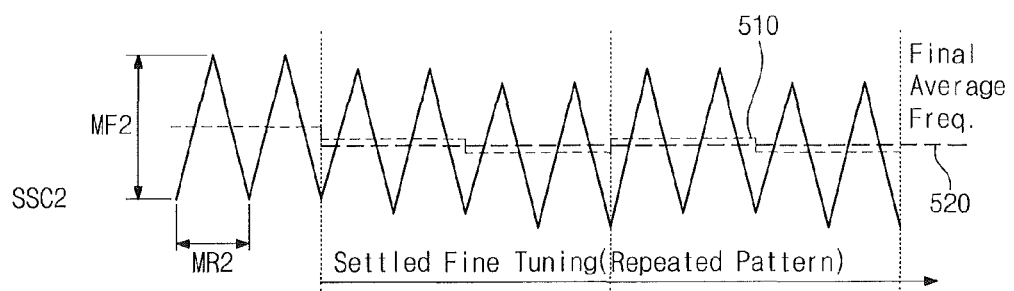
FIG. 5 is a view illustrating an example of a variation of a second spread spectrum clock signal output from a phase lock loop of FIG. 3.

FIG. 5 is a view illustrating an example of a variation of a second spread spectrum clock signal output from the phase lock loop 320 of FIG. 3.

Referring to FIG. 5, an average frequency 510 of the second spread spectrum clock signal SSC2 output from the phase lock loop 320 of FIG. 3 may be controlled according to a variation of the PLL control signal PLL_CODE. The average frequency 510 of the second spread spectrum clock signal SSC2 may be controlled using the above-described method to closely approach the final average frequency 520 corresponding to the average frequency of the first spread spectrum clock signal SSC1.

The phase lock loop 320 may control a phase of an internal feedback signal in response to the PLL control signal PLL_CODE to control the average frequency 510 of the second spread spectrum clock signal SSC2.

Figure 6:
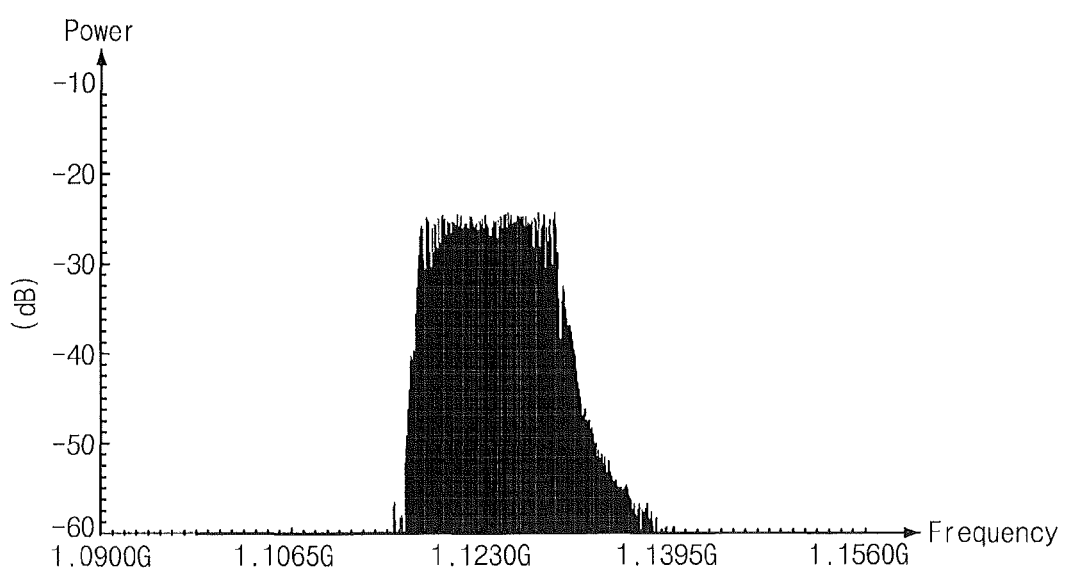
FIG. 6 is a view illustrating an example of a spectrum of a second spread spectrum clock signal output from the spread spectrum clock generator of FIG. 3.

FIG. 6 is a view illustrating an example of a spectrum of the second spread spectrum clock signal SSC2 output from the spread spectrum clock generator 300 of FIG. 3.

Referring to FIG. 6, the spread spectrum clock signal SSC2 of FIG. 3, in which a frequency may be varied according to a predetermined cycle, may have a uniform/substantially uniform power density in the spread spectrum. As such, the second spread spectrum clock signal SSC2 may minimize an electromagnetic interference within an electronic circuit.

Figure 7:
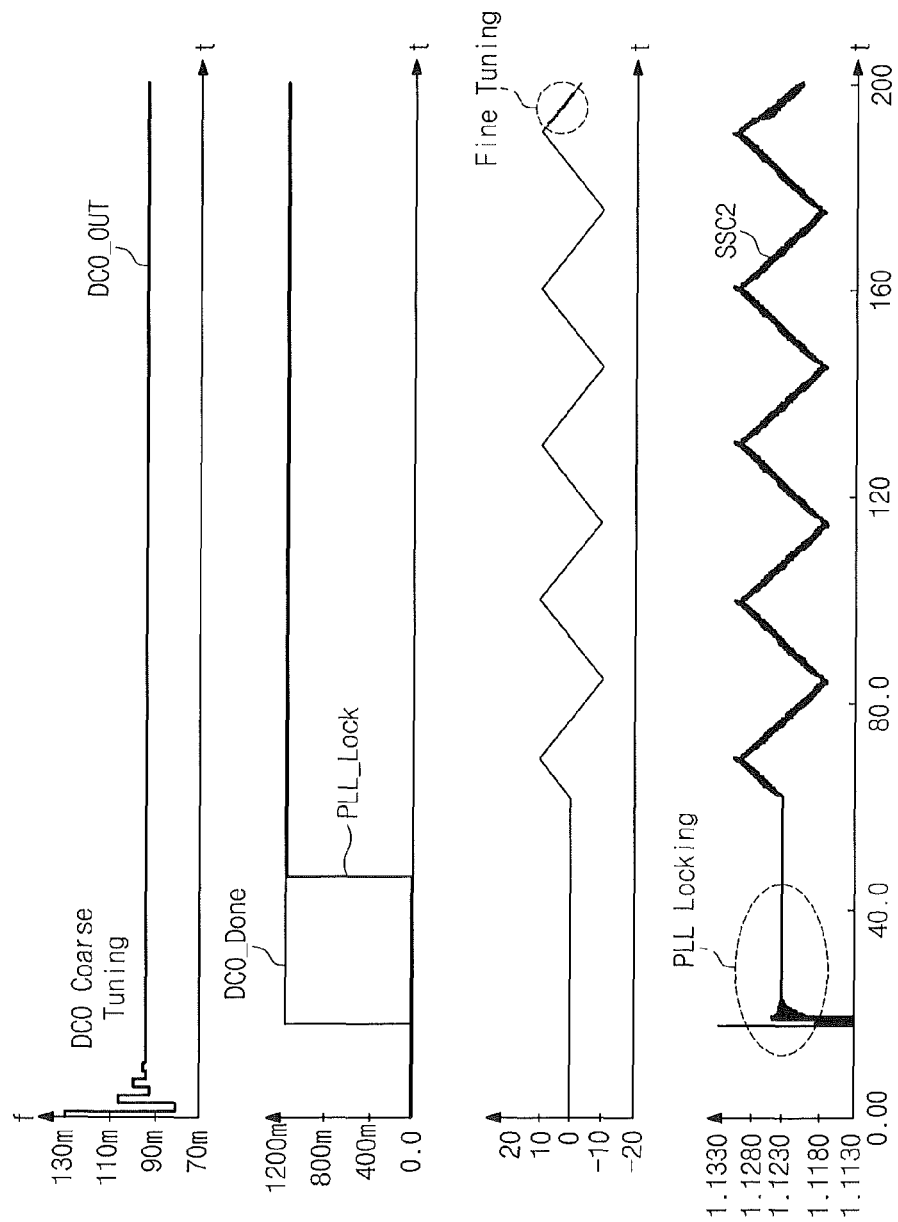
FIG. 7 is a view illustrating an example of a variation of signals generated during an operation of the spread spectrum clock generator of FIG. 3.

FIG. 7 is a view illustrating an example of a variation of signals generated during an operation of the spread spectrum clock generator of FIG. 3.

Referring to FIG. 7, the DCO 311 of FIG. 3 outputs an average frequency signal DCO_OUT having a predetermined frequency in response to the DCO control signal DCO_CODE. The phase lock loop 320 receives the average frequency signal DCO_OUT to perform a phase lock operation. The phase lock loop 320 generates the second spread spectrum signal SSC2 having a second modulation rate and a second modulation frequency in response to the PLL control signal PLL_CODE output from the PLL controller 333.

The spread spectrum clock generator 300 may generate the spread spectrum clock signal SSC2 to have a fractional division ratio such as a fractional-N phase lock loop (PLL) without changing circuit components.

Referring again to FIG. 3, the counter 312 may perform a counter operation in response to the first spread spectrum clock signal SSC1 to output the count signal CNT1. The counter 313 may perform a counter operation in response to the average frequency signal DCO_OUT to output the count signal CNT2.

If the second spread spectrum clock signal SSC2 is a final signal, and a frequency of the second spread spectrum clock signal SSC2 as the final signal is fractional multiple of a frequency of the first spread spectrum clock signal SSC1, a frequency of the average frequency signal DCO_OUT output from the DCO 311 may be set to a fractional multiple of the frequency of the first spread spectrum clock signal SSC1. Thus, an offset of the counter 313 may be set to a desired fractional multiple with respect to the counter 312, and an offset of the counter 332 may be set to a desired fractional multiple with respect to the counter 331.

For example, when it is required that the second spread spectrum clock signal SSC2 has a frequency about 11.1% higher/faster than that of the first spread spectrum clock signal SSC1, the offset of the counter 313 may be set to a value about 11.1% greater than that of the counter 312. Similarly, the offset of the counter 332 may be set to a value about 11.1% greater than that of the counter 331.

To adjust the offsets of the counters 313 and 332, a multiplier may be connected to each of the counters 313 and 332 to multiply a counter value output from each of the counters 313 and 332 by the offset value of each of the counters 313 and 332. For example, when a value of the count signal CNT2 output from the counter 313 is multiplied by about 11.1%, the average frequency of the average frequency signal DCO_OUT output from the DCO 311 may be about 11.1% faster than that of the first spread spectrum clock signal SSC1.

According to some embodiments, the fractional division may be possible without performing a process for correcting the phase lock loop 320.

Figure 8:
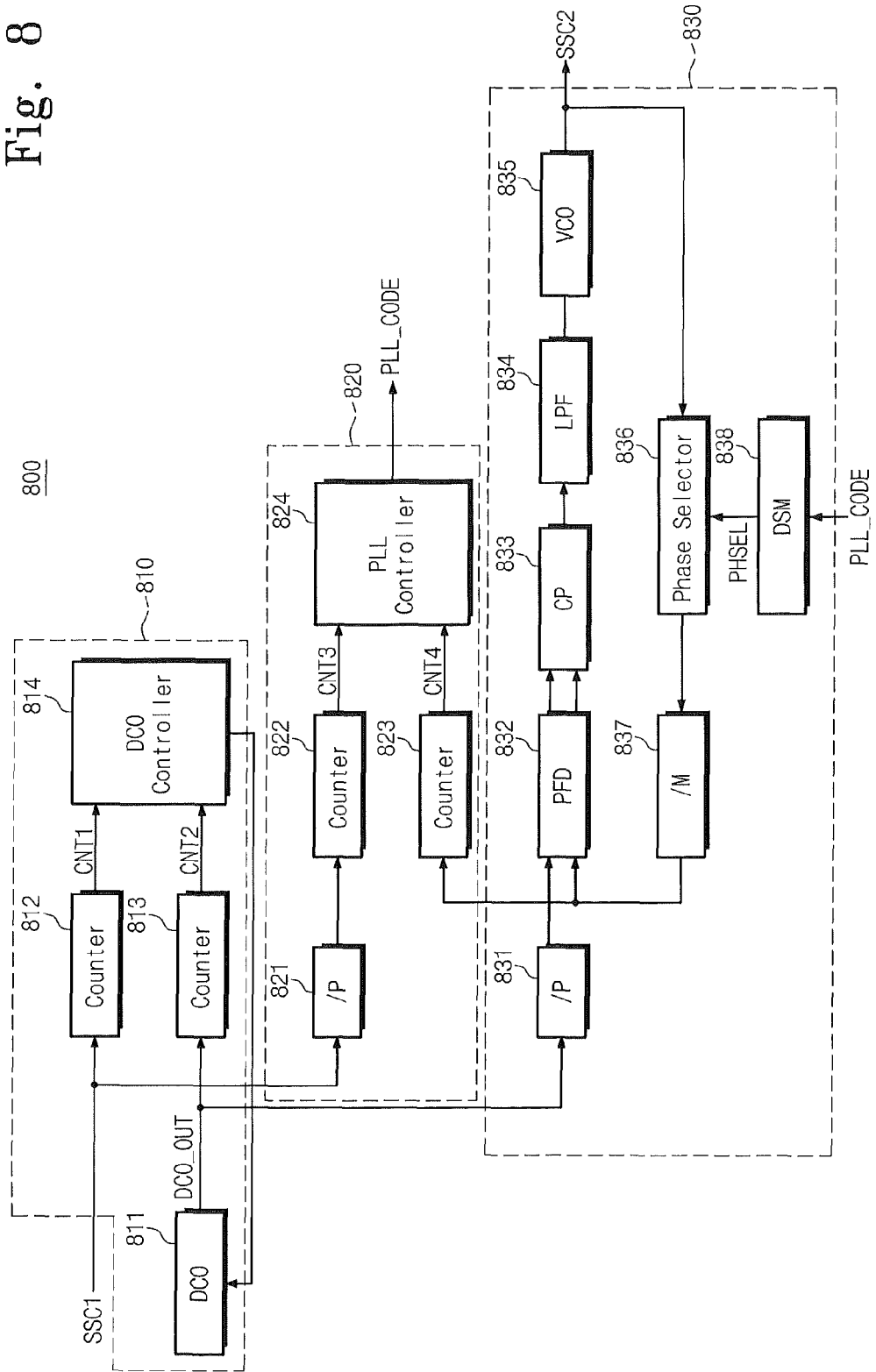
FIG. 8 is a block diagram of a spread spectrum clock generator according to other embodiments.

FIG. 8 is a block diagram of a spread spectrum clock generator according to other embodiments.

Referring to FIG. 8, a spread spectrum clock generator 800 may include an oscillation circuit 810, a control circuit 820, and a phase lock loop 830. The oscillation circuit 810 may have the same structure and operation as the oscillation circuit 310 of the FIG. 3. The control circuit 820 may further include a divider 821, in contrast with the control circuit 330 of FIG. 3. The divider 821 may divide a first spread spectrum clock signal SSC1 by a predetermined division ratio P to provide the divided signal to a counter 822.

The phase lock loop 830 may include a divider 831, a phase frequency detector (PFD) 832, a charge pump (CP) 833, a low pass filter (LPF) 834, a voltage controlled oscillator (VCO) 835, a phase selector 836, a divider 837, and a delta-signal modulator (DSM) 838. The division ratio P of the divider 831 within the phase lock loop 830 may be equal to that of the divider 821 within the control circuit 820. The PFD 832 may compare a frequency of a signal output from the divider 831 to a frequency of a signal output from the divider 837 to generate a pulse signal corresponding to their frequency difference. The CP 833 may output current proportioned to a pulse width of the pulse signal output from the PFD 832. The LPF 834 may remove noise components of the current output from the CP 833. The VCO 835 may output a signal having a frequency corresponding to that of a voltage output from the LPF 834, i.e., a second spread spectrum clock signal SSC2. The phase selector 836 may receive the second spread spectrum clock signal SSC2 to control a phase of the second spread spectrum clock signal SSC2 in response to a phase selection signal PHSEL output from the DSM 838. The divider 837 may divide a signal output from the phase selector 836 by a predetermined division ratio M to provide the divided signal to the PFD 832. The DSM 838 may output the phase selection signal PHSEL corresponding to a PLL control signal PLL_CODE output from the control circuit 820.

The phase lock loop 830 may control a phase of an internal feedback signal in response to the PLL control signal PLL_CODE output from the control circuit 820 to control an average frequency of the second spread spectrum clock signal SSC2.

As compared with FIG. 3, the counter 822 within the control circuit 820 of FIG. 8 may receive a signal in which the first spread spectrum clock signal SSC1 is divided by the predetermined division ratio P, and the counter 823 within the control circuit 820 may receive a signal in which the second spread spectrum clock signal SSC2 is fed back through the phase selector 836 and the divider 837. This may prevent counters 822 and 823, which may include flip-flops, from being out of order due to a very high frequency of the second spread spectrum clock signal SSC2.

Figure 9:
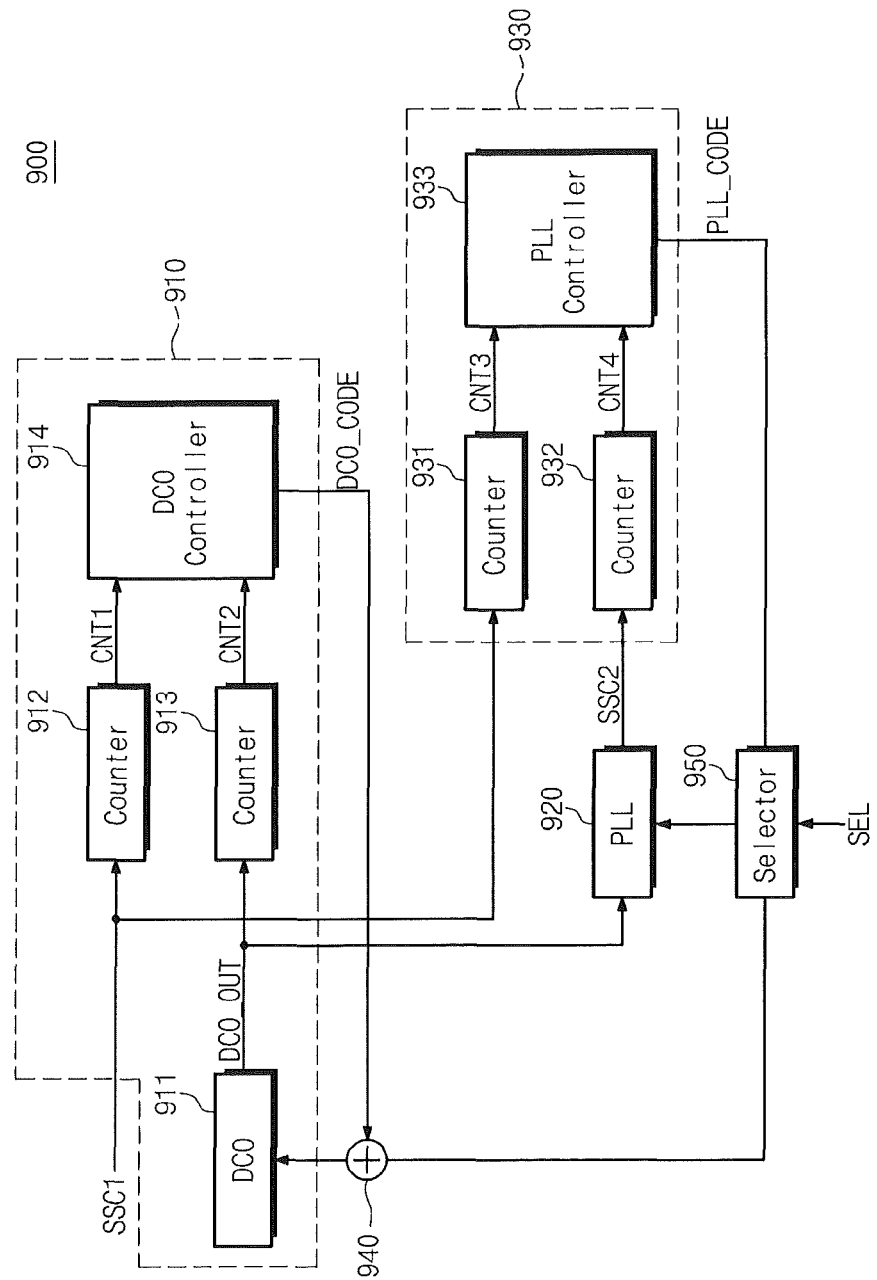
FIG. 9 is a block diagram of a spread spectrum clock generator according to other embodiments.

FIG. 9 is a block diagram of a spread spectrum clock generator 900 according to other embodiments.

The spread spectrum clock generator 900 of FIG. 9 may be similar to that of the spread spectrum clock generator 300 of FIG. 3. However, the spread spectrum clock generator 900 may further include an adder 940 and a selector 950. The selector 950 may selectively transmit a PLL control signal PLL_CODE output from a PLL controller 933 to any one of the adder 940 and a phase lock loop 920. For example, if the selector 950 transmits the PLL control signal PLL_CODE output from the PLL controller 933 to the phase lock loop 920, then the spread spectrum clock generator 900 may be operated by the same method as that of the spread spectrum clock generator 300 of FIG. 3. Alternatively, when the selector 950 provides the PLL control signal PLL_CODE output from the PLL controller 933 to the adder 940, the adder 940 adds the DCO control signal DCO_CODE to the PLL control signal PLL_CODE and then provides the resultant signal to a DCO 911.

Accordingly, the PLL control signal PLL_CODE compensating for an error between an average frequency of a second spread spectrum clock signal SSC2 and a mathematical average/mean frequency of the first spread spectrum clock signal SSC1 may be provided to the DCO 911. As a result, a frequency signal DCO_OUT may be output from the DCO 911 during an operation of the phase lock loop 920, and the phase lock loop 920 may receive the frequency signal DCO_OUT having a controlled frequency.

Figure 10:
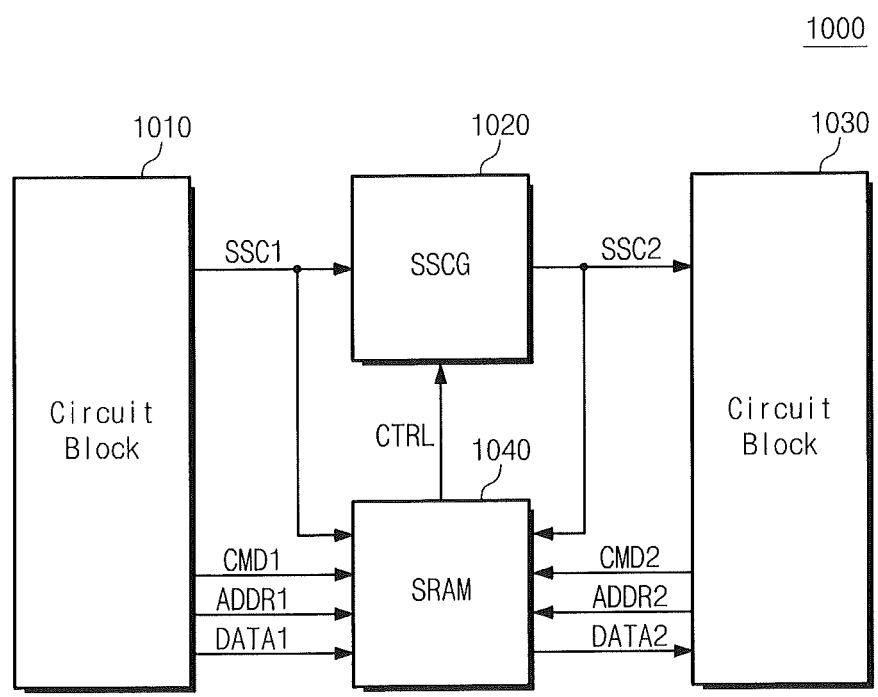
FIG. 10 is a view of a display device including a spread spectrum clock generator according to some embodiments.

FIG. 10 is a view of a display device 1000 including a spread spectrum clock generator SSCG 1020 according to some embodiments.

Referring to FIG. 10, the display device 1000 may include circuit blocks 1010 and 1030, the spread spectrum clock generator SSCG 1020, and a static random access memory (SRAM) 1040. The display device 1000 is merely one example. Other examples may include various electronic devices including circuit blocks that are operated by synchronizing with clock signals having frequencies different from each other.

The spread spectrum clock generator SSCG 1020 may be connected between the two circuit blocks 1010 and 1030. The circuit block 1010 may output a first spread spectrum clock signal SSC1 having a first modulation rate and a first modulation frequency. The spread spectrum clock generator SSCG 1020 may receive the first spread spectrum clock signal SSC1 to generate a second spread spectrum clock signal SSC2 having a second modulation rate and a second modulation frequency. The second spread spectrum clock signal SSC2 generated from the spread spectrum clock generator SSCG 1020 may be supplied to the circuit block 1030.

The SRAM 1040 may be provided with a dual port memory, which may be simultaneously accessible by the two circuit blocks 1010 and 1030. The SRAM 1040 may receive the first spread spectrum clock signal SSC1, a read command CMD1, an address ADDR1, and data DATA1 from the circuit block 1010, and may receive a write command CMD2 and an address ADDR2 from the circuit block 1030 and the second spread spectrum clock signal SSC2 to output data DATA2. The SRAM 1040 may thus function as a buffer between the circuit blocks 1010 and 1030, which may be operated by clocks having frequencies different from each other.

The circuit block 1010 may synchronize with the first spread spectrum clock signal SSC1 to write the data DATA1 in the SRAM 1040, and the circuit block 1030 may synchronize with the second spread spectrum clock signal SSC2 to read the data DATA2 from the SRAM 1040. The data DATA1 stored in the SRAM 1040 by the circuit block 1010 may be (red-green-blue) RGB data. For example, the SRAM 1040 may have a volume/capacity equal to a data volume of one frame of the RGB data.

The address ADDR1 may be generated prior to the address ADDR2 by several cycles to read the data DATA2 by the circuit block 1030 after the data DATA1 is written in the SRAM 1040 from the circuit block 1010.

If the average frequency of the first spread spectrum clock signal SSC1 is excessively faster than that of the second spread spectrum clock signal SSC2, then the circuit block 1010 may write the whole data of a K-th frame in the SRAM 1040, and then write data of a (K+1)th frame. However, an overflow phenomenon may occur in which the circuit block 1030 does not read the whole data of the K-th frame. On the other hand, when a frequency of the first spread spectrum clock signal SSC1 is significantly slower than that of the second spread spectrum clock signal SSC2, an underflow phenomenon may occur in which the circuit block 1030 reads the data of the K-th frame from the SRAM 1040 before the circuit block 1010 writes the whole data of the K-th frame in the SRAM 1040. In this case, the circuit block 1030 may read the data of the (K−1)th frame as the data of K-th frame.

The SRAM 1040 according to some embodiments may compare the addresses ADDR1 and ADDR2 transmitted from the circuit blocks 1010 and 1030 to output a corresponding control signal CTRL when a difference between the addresses ADDR1 and ADDR2 is less than or greater than a predetermined value. The spread spectrum clock generator SSCG 1020 may change a frequency of the second spread spectrum clock signal SSC2 in response to the control signal CTRL.

Figure 11A:
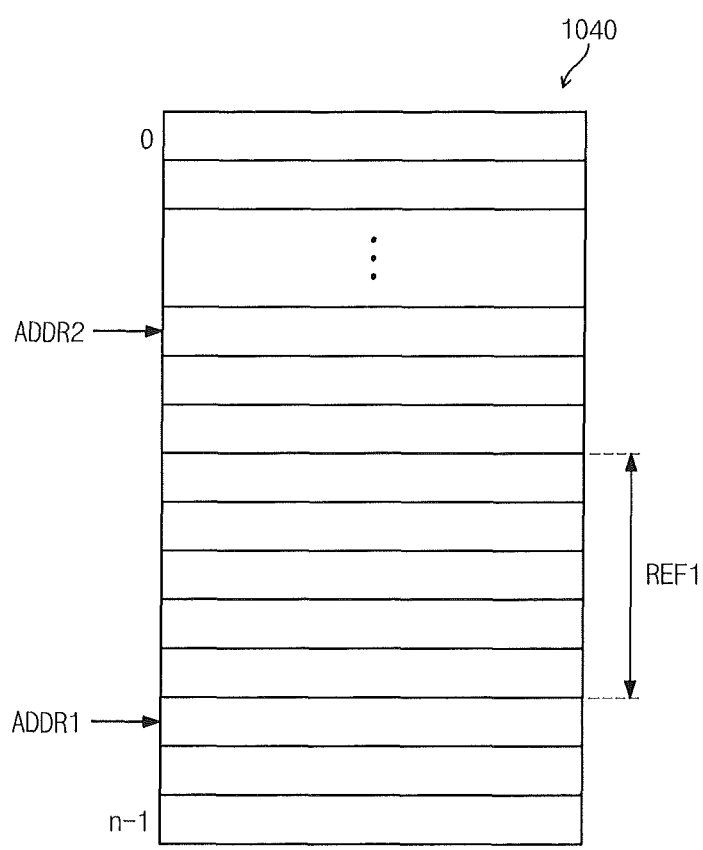
FIGS. 11A and 11B include views illustrating comparisons between addresses provided from circuit blocks of FIG. 10 to a memory.
Figure 11B:
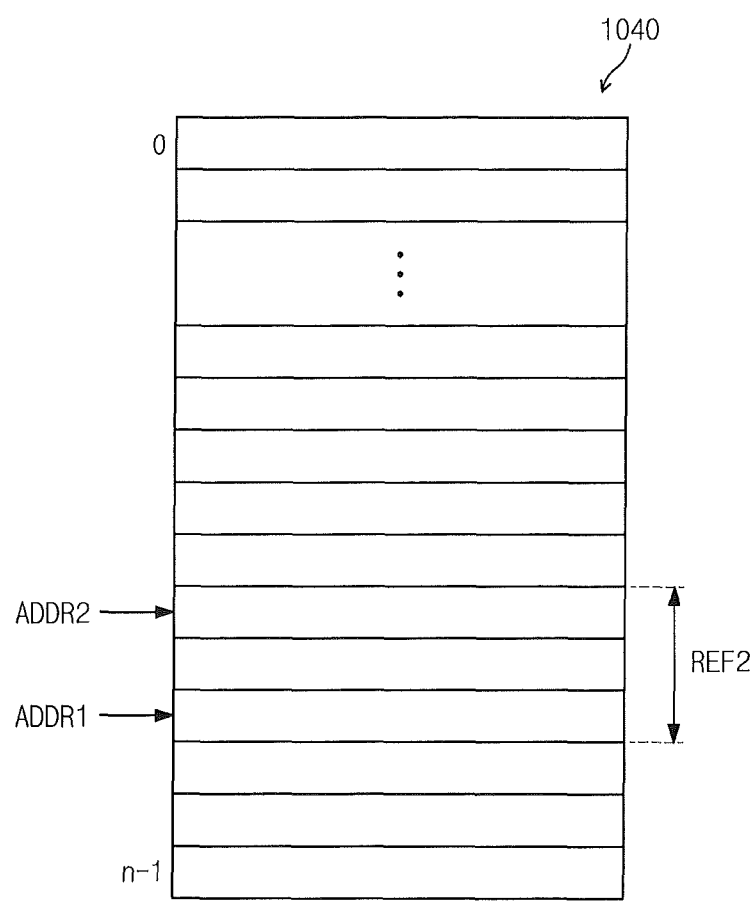

FIGS. 11A and 11B are views illustrating comparisons between the addresses ADDR1 and ADDR2 provided from the circuit blocks 1010 and 1030 of FIG. 10 to the SRAM 1040.

Referring to FIG. 11A, the SRAM 1040 may include n memory regions, which may be accessible by the circuit blocks 1010 and 1030 of FIG. 10. Each of the plurality of memory regions may be assigned by the addresses ADDR1 and ADDR2 from the circuit blocks 1010 and 1030. Also, the addresses ADDR1 and ADDR2 may be compared to each other to compare frequencies of the first and second spread spectrum clock signals SSC1 and SSC2.

For example, if a value of the address ADDR1 from the circuit block 1010 is greater than that of the address ADDR2 from the circuit block 1030 and a difference between the addresses ADDR1 and ADDR2 is greater than a first reference value REF1, the frequency of the second spread spectrum clock signal SSC2 may be increased. On the other hand, as shown in FIG. 11B, when the value of the address ADDR1 from the circuit block 1010 and the difference between the addresses ADDR1 and ADDR2 is less than a second reference value REF2, the frequency of the second spread spectrum clock signal SSC2 may be decreased.

Also, when the value of the address ADDR2 from the circuit block 1030 is greater than that of the address ADDR1 from the circuit 1010, the frequency of the second spread spectrum clock signal SSC2 may be decreased. The SRAM 1040 of FIG. 10 may compare the addresses ADDR1 and ADDR2 to each other to output the control signal CTRL according to the resultant value.

Figure 12:
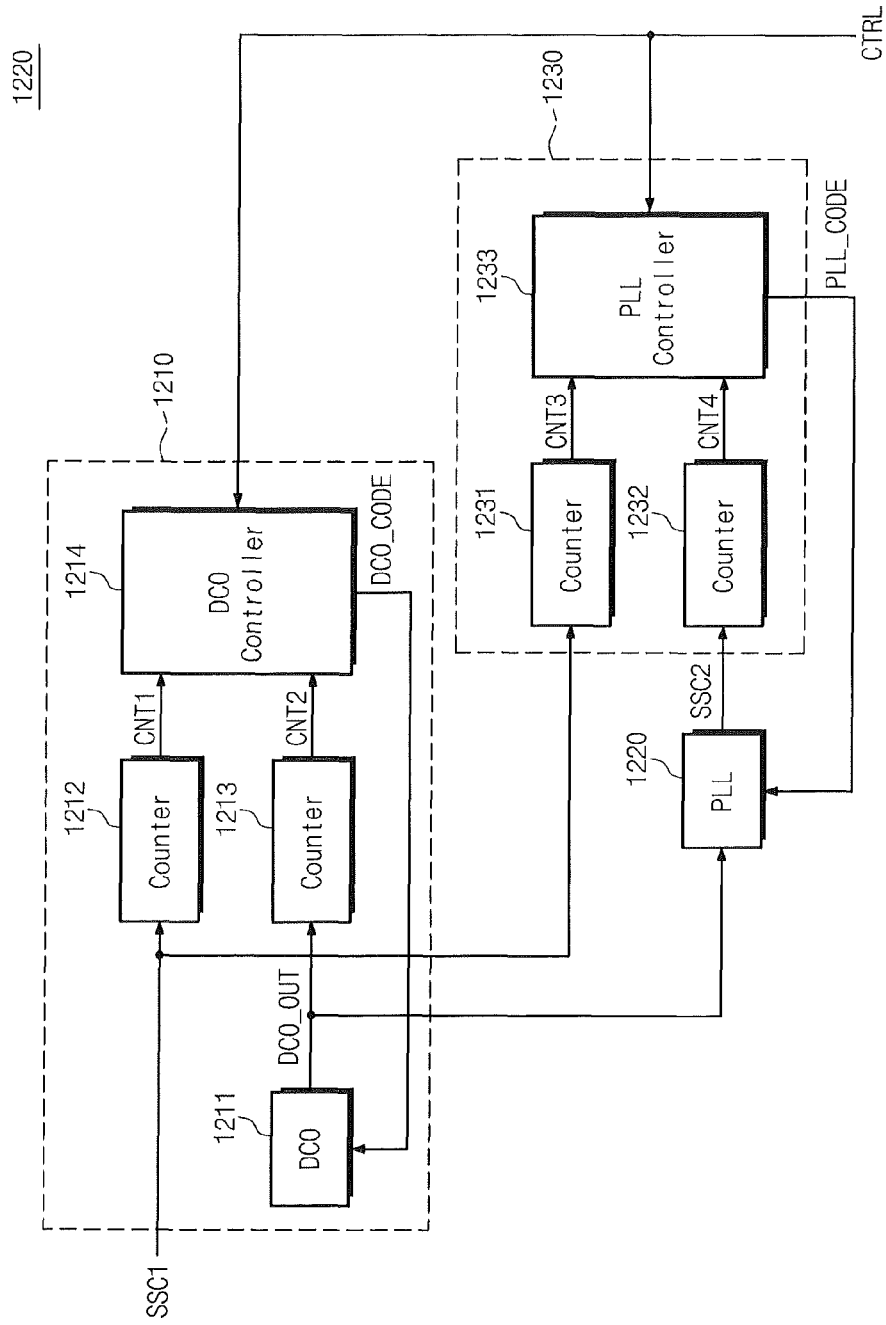
FIG. 12 is a view illustrating another example of the spread spectrum clock generator of FIG. 10.

FIG. 12 is a view illustrating another example of the spread spectrum clock generator 1020 of FIG. 10.

A spread spectrum clock generator 1220 of FIG. 12 may have components similar to those of the spread spectrum clock generator 300 of FIG. 3. However, in the spectrum clock generator 1220, a DCO controller 1214 and a PLL controller 1233 may receive a control signal CTRL from the SRAM 1040. The DCO controller 1214 may be set to generate a DCO control signal DCO_CODE in response to one of count signals CNT1 and CNT2 transmitted from counters 1212 and 1213 and a control signal CTRL transmitted from the SRAM 1040. Similarly, the PLL controller 1233 may be set to generate a PLL control signal PLL_CODE in response to one of count signals CNT3 and CNT4 transmitted from counters 1231 and 1232 and the control signal CTRL transmitted from the SRAM 1040.

For example, in embodiments where the DCO controller 1214 and the PLL controller 1233 are set to be operated in response to the control signal CTRL transmitted from the SRAM 1040, the DCO controller 1214 may increase a digital value of the DCO control signal DCO_CODE, and the PLL controller 1233 may increase a digital value of the PLL control signal PLL_CODE, when the control signal CTRL represents an increase of a frequency of the second spread spectrum clock signal SSC2.

Alternatively, when the control signal CTRL represents a decrease of the frequency of the second spread spectrum clock signal SSC2, the DCO controller 1214 may decrease the digital value of the DCO control signal DCO_CODE, and the PLL controller 1233 may decrease the digital value of the PLL control signal PLL_CODE.

If the DCO controller 1214 and the PLL controller 1233 are set to be operated in response to the count signals CNT1, CNT2, CNT3, and CNT4 transmitted from the counters 1212, 1213, 1231, and 1232, respectively, then the spread spectrum clock generator 1220 may be operated with the same process as that of the spread spectrum clock generator 300 of FIG. 3.

Figure 13:
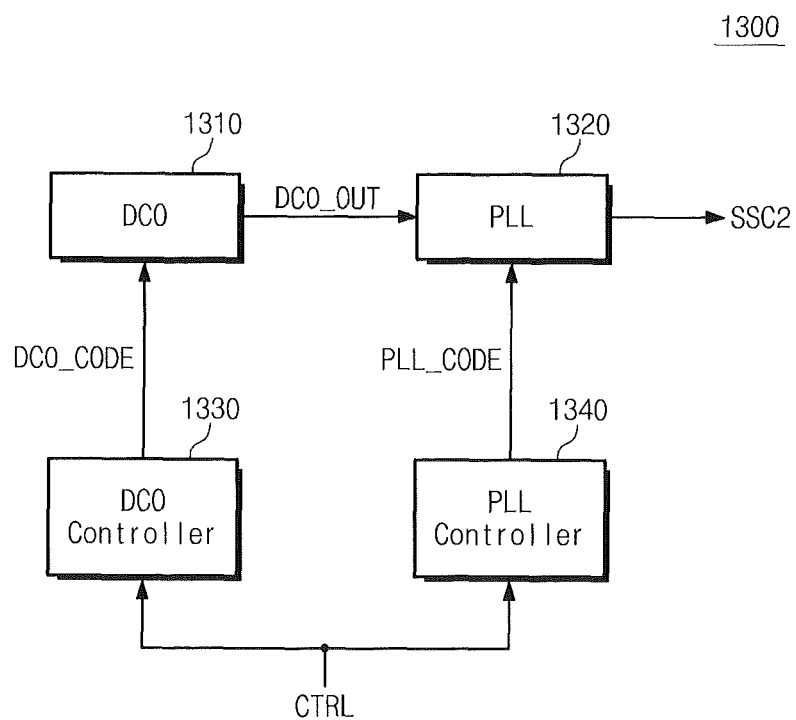
FIG. 13 is a view illustrating another example of the spread spectrum clock generator of FIG. 10.

FIG. 13 is a view illustrating another example of the spread spectrum clock generator 1020 of FIG. 10.

A spread spectrum clock generator 1300 may include a digital controlled oscillator (DCO) 1310, a phase lock loop (PLL) 1320, a DCO controller 1330, and a PLL controller 1340. The DCO 1310 may generate an average frequency signal DCO_OUT having a predetermined frequency in response to a DCO control signal DCO_CODE transmitted from a DCO controller 1330. The PLL 1320 may generate a second spread spectrum clock signal SSC2 in response to a PLL control signal PLL_CODE transmitted from the PLL controller 1340. The DCO controller 1330 and the PLL controller 1340 may generate the DCO control signal DCO_CODE and the PLL control signal PLL_CODE, respectively, in response to the control signal CTRL transmitted from the SRAM 1040 of FIG. 10.

If the control signal CTRL transmitted from the SRAM 1040 of FIG. 10 represents an increase of a frequency of the second spread spectrum clock signal SSC2, then the DCO controller 1330 may increase a digital value of the DCO control signal DCO_CODE, and the PLL controller 1340 may increase a digital value of the PLL control signal PLL_CODE.

Alternatively, if the control signal CTRL represents a decrease of the frequency of the second spread spectrum clock signal SSC2, the DCO controller 1330 may decrease the digital value of the DCO control signal DCO_CODE, and the PLL controller 1340 may decrease the digital value of the PLL control signal PLL_CODE. Through the above-described processes, the frequency of the average frequency signal DCO_OUT and an average frequency of the second spread spectrum clock signal SSC2 may be adjusted.

Figure 14:
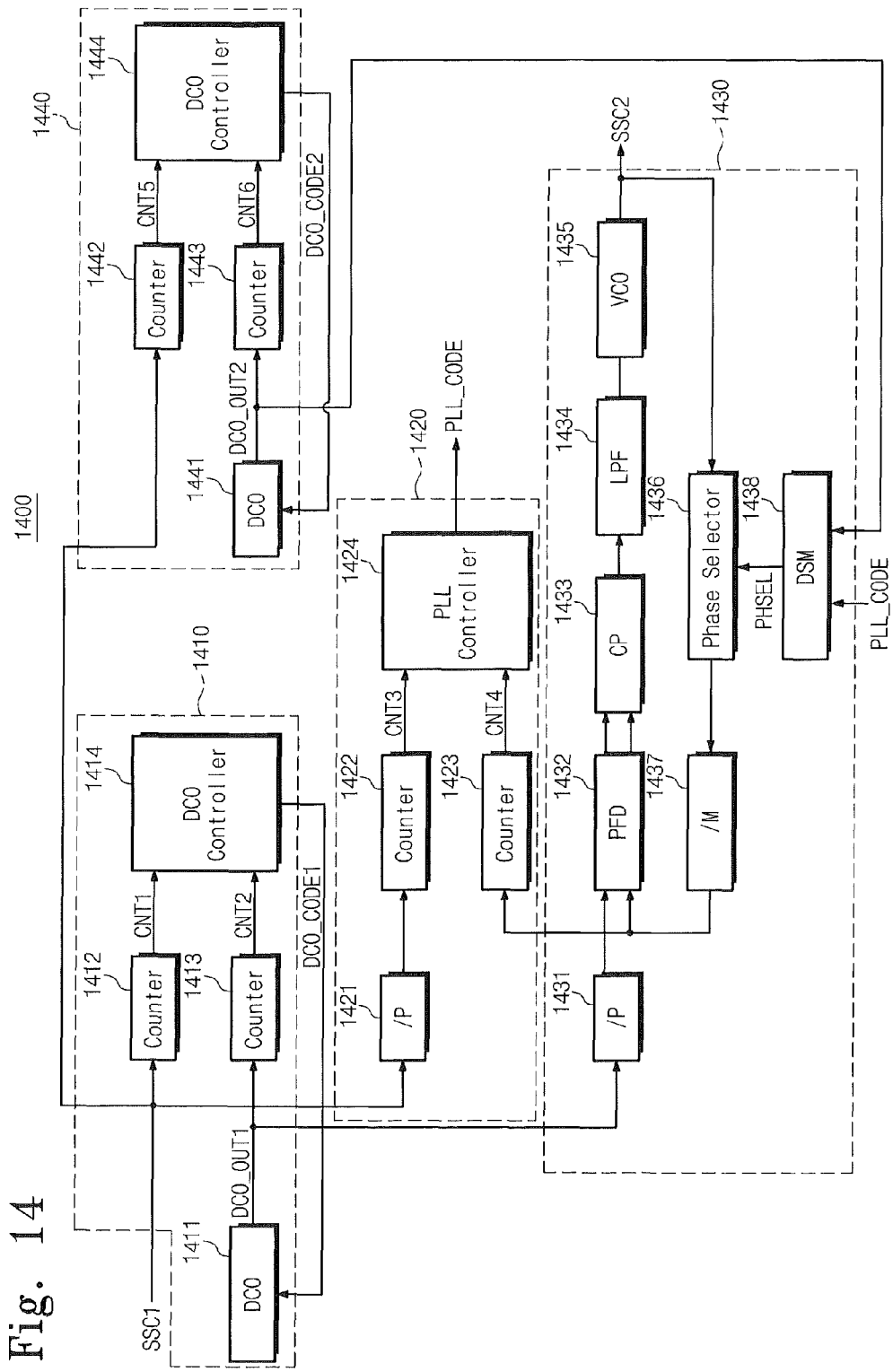
FIG. 14 is a view of a spread spectrum clock generator according to other embodiments.

FIG. 14 is a view of a spread spectrum clock generator 1400 according to other embodiments.

Referring to FIG. 14, the spread spectrum clock generator 1400 may include oscillation circuits 1410 and 1440, a control circuit 1420, and a phase lock loop (PLL) 1430. That is, the spread spectrum clock generator 1400 of FIG. 14 may have a component similar to that of the spread spectrum clock generator 800 of FIG. 8. However, the spread spectrum clock generator 1400 may further include the oscillation circuit 1440.

The oscillation circuit 1410 may include a digital controlled oscillator (DCO) 1411, counters 1412 and 1413, and a DCO controller 1414. The DCO 1411 may generate an average frequency signal DCO_OUT1. The counter 1412 may perform a counter operation in response to a first spread spectrum clock signal SSC1 to output a count signal CNT1. The counter 1413 may perform a counter operation in response to the average frequency signal DCO_OUT1 output from the DCO 1411 to output a count signal CNT2. The DCO controller 1414 may output a DCO control signal DCO_CODE1 in response to the count signals CNT1 and CNT2 output from the counters 1412 and 1413.

The oscillation circuit 1440 may include components similar to (or even equal to) those of the oscillation circuit 1410. The oscillation circuit 1440 may include a digital controlled oscillator (DCO) 1441, counters 1442 and 1443, and a DCO controller 1444. The DCO 1441 may generate a reference average frequency signal DCO_OUT2. The counter 1442 may perform a counter operation in response to the first spread spectrum clock signal SSC1 to output a count signal CNT5. The counter 1443 may perform a counter operation in response to the average frequency signal DCO_OUT2 output from the DCO 1441 to output a count signal CNT6. The DCO controller 1444 may output a DCO control signal DCO_CODE2 in response to the counters signals CNT5 and CNT6 output from the counters 1442 and 1443. The reference average frequency signal DCO_OUT2 output from the DCO 1441 may be provided to a delta-signal modulator (DSM) 1438 of a phase lock loop (PLL) 1430. The DSM 1438 may use the reference average frequency signal DCO_OUT2 as a reference clock signal.

A characteristic of a second spread spectrum clock signal SSC2 output from the phase lock loop (PLL) 1430 may be decided by the DSM 1438. The reference clock signal may be required for constantly maintaining a characteristic of a modulated frequency of the characteristic of the second spread spectrum clock signal SSC2. In general, because circuit blocks used for an intra-panel interface do not include devices for generating the reference clock signal, the reference clock signal may be generated using the first spread spectrum clock signal SSC1 that is an input clock signal. Here, the spread spectrum clock generator 1400 may not know a frequency of the first spread spectrum clock signal SSC1. Thus, the spread spectrum clock generator 1400 may include a memory, such as an EEPROM within the DSM 1438. Also, a frequency code value of the first spectrum clock signal SSC1 that is the input clock signal may be stored in the memory. According to the above-described method, the spread spectrum clock generator 1400 may generate the reference clock signal using the frequency code stored in the memory. However, a change of the frequency of the first spread spectrum clock signal SSC1 may occur because of various reasons, such as because a user takes away a plug of a display device and then inserts the plug again or because of a change of set data. As described above, the frequency code of the reference clock signal stored in the memory may be maintained with the same value even though the frequency of the first spread spectrum clock signal SSC1 may change. Thus, the characteristic of the second spread spectrum clock signal SSC2 may be changed.

To reduce/prevent the above-described limitations, according to some embodiments, the spread spectrum clock generator 1400 may further include the oscillation circuit 1440. Initially, the oscillation circuit 1410 may output the average frequency signal DCO_OUT1 corresponding to the first spread spectrum clock signal SSC1, and the oscillation circuit 1440 may output the reference average frequency signal DCO_OUT2. The signals DCO_OUT1 and DCO_OUT2 may have the same average frequency. The DCO controller 1444 within the oscillation circuit 1440 may compare the count signals CNT5 and CNT6 to each other to output the DCO control signal DCO_CODE2. If the DCO control signal DCO_CODE2 does not change at a predetermined time, then the DCO control signal DCO_CODE2 may be fixed. Thus, the DCO 1441 may output the fixed reference average frequency signal DCO_OUT2. The reference average frequency signal DCO_OUT2 may be provided as a reference clock signal to the DSM 1438.

Because the reference average frequency signal DCO_OUT2 may be constantly maintained during the operation of the spread spectrum clock generator 1400, the second spread spectrum clock signal SSC2 may be generated having stable characteristics.

According to some embodiments, although the input signal may be the spread spectrum clock signal having various modulation rates and modulation frequencies, the spread spectrum clock generator may generate a spread spectrum clock signal having a novel modulation rate and modulation frequency.

The above-disclosed subject matter is to be considered illustrative and not restrictive, and the appended claims are intended to cover all such modifications, enhancements, and other embodiments, which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. An electronic device, comprising:
    a memory;
    a first circuit block configured to output a first spread spectrum clock signal and a first address for accessing the memory;
    a second circuit block configured to operate in response to a second spread spectrum clock signal, the second circuit block configured to output a second address for accessing the memory; and
    a spread spectrum clock signal generator configured to receive the first spread spectrum clock signal to generate the second spread spectrum clock signal,
    wherein the memory is configured to compare the first and second addresses to each other to output a clock generator control signal corresponding to a difference between the first and second addresses, and wherein the spread spectrum clock signal generator is configured to generate the second spread spectrum clock signal in response to the clock generator control signal.

2. The electronic device of claim 1, wherein the spread spectrum clock signal generator comprises:
    a first controller configured to output a digital controlled oscillator control signal corresponding to the clock generator control signal;
    a digital controlled oscillator configured to output an average frequency signal having a frequency corresponding to that of the digital controlled oscillator control signal;
    a second controller configured to output a phase lock loop control signal corresponding to the clock generator control signal; and
    a phase lock loop configured to receive the average frequency signal and to output the second spread spectrum clock signal in response to the phase lock loop control signal.

3. The electronic device of claim 1, wherein the spread spectrum clock signal generator is configured to increase a frequency of the second spread spectrum clock signal if the difference between the first and second addresses is greater than a first reference value.

4. The electronic device of claim 1, wherein the spread spectrum clock signal generator is configured to decrease a frequency of the second spread spectrum clock signal if the difference between the first and second addresses is less than a second reference value.

5. The electronic device of claim 1, wherein the memory includes a dual port static random access memory.

6. An electronic device, comprising:
    a memory;
    a first circuit block configured to output a first spread spectrum clock signal and a first address for accessing the memory;
    a second circuit block configured to operate in response to a second spread spectrum clock signal, the second circuit block configured to output a second address for accessing the memory; and
    a spread spectrum clock signal generator configured to receive the first spread spectrum clock signal and to output an average frequency signal to generate the second spread spectrum clock signal,
    wherein the memory is configured to compare the first and second addresses to each other to output a clock generator control signal corresponding to a difference between the first and second addresses, and wherein the spread spectrum clock signal generator is configured to generate the second spread spectrum clock signal in response to the clock generator control signal.

7. The electronic device of claim 6, wherein the spread spectrum clock signal generator comprises:
    a first controller configured to output a digital controlled oscillator control signal corresponding to the clock generator control signal;
    a digital controlled oscillator configured to output the average frequency signal having a frequency corresponding to that of the digital controlled oscillator control signal;
    a second controller configured to output a phase lock loop control signal corresponding to the clock generator control signal; and
    a phase lock loop configured to receive the average frequency signal and to output the second spread spectrum clock signal in response to the phase lock loop control signal.

* * * * *